United States Patent [19]

Reyes et al.

[11] Patent Number: 5,774,367
[45] Date of Patent: Jun. 30, 1998

[54] METHOD OF SELECTING DEVICE THRESHOLD VOLTAGES FOR HIGH SPEED AND LOW POWER

[75] Inventors: Alberto J. Reyes, Phoenix; Daniel J. Snyder, Peoria; Sleiman N. Chamoun; Karen S. Ramondetta, both of Phoenix, all of Ariz.

[73] Assignee: Motorola, Inc., Schaumburg, Ill.

[21] Appl. No.: 506,447

[22] Filed: Jul. 24, 1995

[51] Int. Cl.[6] .................................................. G06F 15/00
[52] U.S. Cl. .......................................... 364/488; 364/491
[58] Field of Search .................................. 395/551, 558; 365/189.9, 226, 227; 327/530, 544; 364/488, 489, 490, 491

[56] References Cited

U.S. PATENT DOCUMENTS

| | | | |
|---|---|---|---|
| 5,426,383 | 6/1995 | Kumar | 326/119 |
| 5,426,591 | 6/1995 | Ginetti et al. | 364/489 |
| 5,461,576 | 10/1995 | Tsay et al. | 364/490 |
| 5,541,885 | 7/1996 | Takashima | 365/226 |
| 5,598,344 | 1/1997 | Dangelo et al. | 364/489 |

*Primary Examiner*—Dennis M. Butler
*Attorney, Agent, or Firm*—Rennie William Dover

[57] ABSTRACT

A method of selecting device (14–16, 18–24, 28–30) threshold voltages for high speed and low overall power involves identifying (42) the critical paths by predetermined timing criteria. All transistors have an initial, typically high, threshold voltage (40). Transistors outside the critical paths keep the initial high threshold voltages to minimize static power drain. The transistors in the critical path are selected (43) according to a predetermined sorting function to have a low threshold voltage and thereby switch faster. Although the lower threshold voltage devices consume more static power in standby mode, the power drain is accepted as a trade-off in favor of increased speed through the critical path. The supply voltage is reduced to minimize dynamic power. The integrated circuit is thus optimized to run at a higher frequency with lower overall power consumption.

19 Claims, 3 Drawing Sheets

METHOD OF SELECTING DEVICE THRESHOLD VOLTAGES FOR HIGH SPEED AND LOW POWER

BACKGROUND OF THE INVENTION

The present invention relates to integrated circuit design and, more particularly, to selecting device threshold voltages in optimizing a circuit design for high speed and low power consumption.

High speed and power consumption are important integrated circuit (IC) design considerations especially in battery applications such as pagers and cellular and cordless phones. The total power consumption is generally divided into two components, dynamic power and static power. The dynamic power is that consumed during normal operation of the circuit for amplification, switching, and generally driving transistors from one state to another and overcoming the associated capacitive loads. The static power is that consumed by quiescent leakage currents in standby mode when the circuit is inactive. The battery life can be extended by minimizing power consumption in the circuit during both normal operation and in standby mode.

In the prior art, a common technique of reducing power consumption is to simply reduce the supply voltage. Dynamic power consumption is a function of the square of the supply voltage. Therefore, reducing the supply voltage has a significant effect on reducing dynamic power consumption. However, at some point determined by the semiconductor process, as the supply voltage approaches the device threshold voltage where the device begins to conduct, the sub-threshold leakage currents can still drain the battery even though the dynamic power has been substantially reduced.

Hence, a need exists to maintain high speed operation while reducing total power consumption in an integrated circuit including dynamic power and static power.

DETAILED DESCRIPTION OF THE PREFERRED EMBODIMENT

Figure 1:
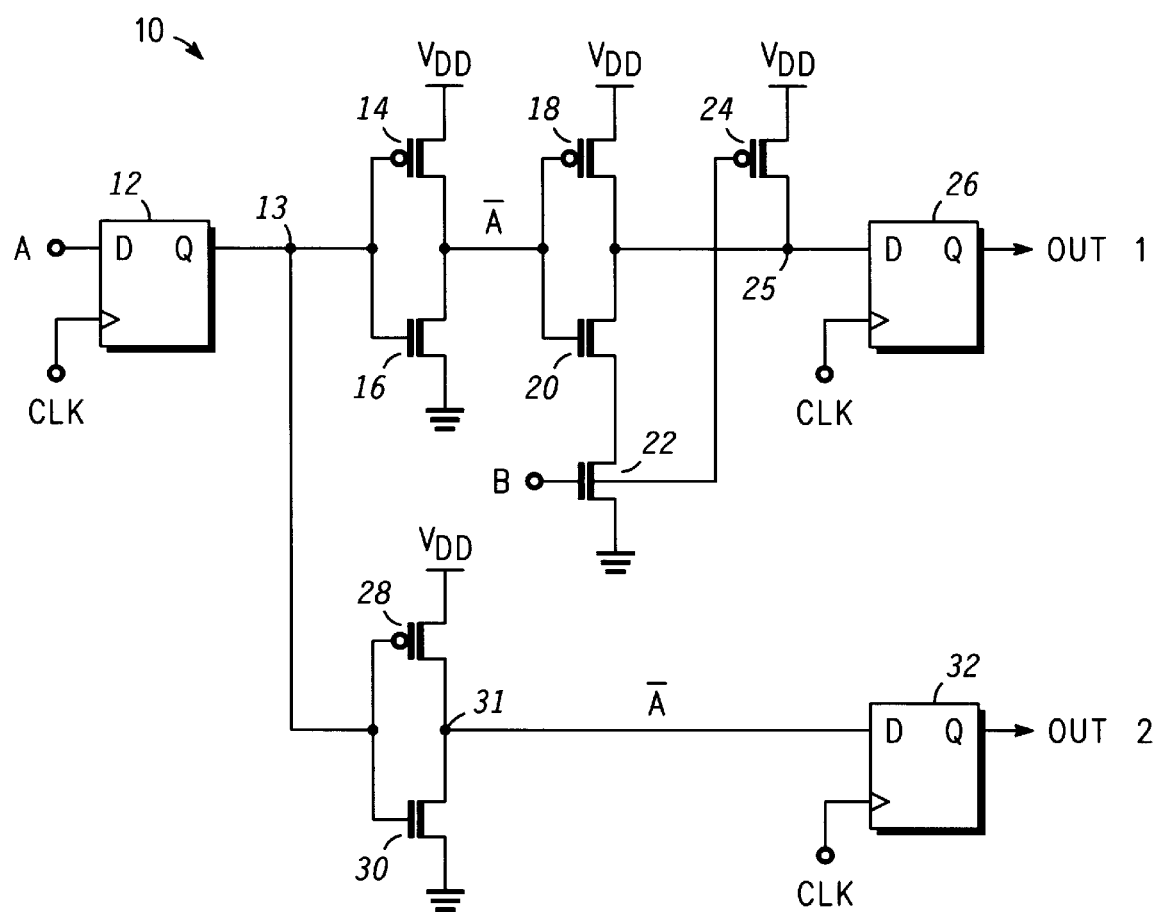
FIG. 1 is a schematic diagram of an integrated circuit.

Referring to FIG. 1, a schematic diagram of a digital integrated circuit 10 is shown. Circuit 10 may be an existing design being converted for low supply voltage operation, for example $V_{DD}=1.0$ volts, or a new design that must operate with high speed, low supply voltage, and low power. D-type flipflop 12 receives input A at its D-input and clock signal CLK at its clock input. The Q-output of flipflop 12 at node 13 is coupled to the gates of transistors 14 and 16 operating as an inverter for providing signal $\overline{A}$. The combination of transistors 18, 20, 22, and 24 operate as a NAND gate receiving signals $\overline{A}$ and B. The output of the NAND gate at node 25 is applied to the D-input of flipflop 26 which clocks the result $\overline{A \cdot B}$ to OUT1 in response to clock signal CLK. The Q-output of flipflop 12 is also routed through transistors 28 and 30 operating as an inverter for providing signal $\overline{A}$ at node 31. D-type flipflop 32 clocks the signal $\overline{A}$ from inverter 28–30 to OUT2 in response to clock signal CLK.

The transistors in FIG. 1 each have a gate threshold voltage ($V_t$) that defines the point where it turns on and begins to conduct. By using a multiple threshold voltage process discussed below, the transistors can be set to have different threshold voltages, even where they are adjacent to one another. Transistors with a low $V_t$ operate at higher switching speeds with the lower supply voltage in comparison with high $V_t$ transistors because they switch into conduction with a smaller gate voltage. On the down side, lowering the threshold voltage increases leakage current and static power consumption. Circuits having high $V_t$ transistors operate slower because it takes more time for the gate voltage to reach the necessary level to start conduction, and because the saturation current is lower which causes the transistor to take more time to charge a capacitive load. High $V_t$ transistors conduct less leakage current in standby mode and therefore dissipate less static power.

For circuit designs such as shown in FIG. 1, the goal is to maximize operating speed while minimizing dynamic and static power consumption. The dynamic power can be reduced by simply decreasing the supply voltage to $V_{DD}=1.0$ volts. However, as discussed in the background, lowering the supply voltage tends to adversely effect operating speed. The maximum operating speed of an integrated circuit is generally determined by timing through one or more critical paths. A critical path is defined between two nodes in the IC separated by circuit elements where the propagation delay through the elements exceeds or possibly barely meets timing constraints in the path established for example relative to the clock signal. One method of increasing speed is to lower the threshold voltage of the transistors in the critical path. Transistors with a lower $V_t$ switch faster to minimize propagation delay through critical timing paths of the IC. The increased speed comes with a cost of higher leakage current in the device with a low $V_t$ and greater associated static power consumption in standby mode.

As a feature of the present invention, the critical paths of circuit 10 are identified by predetermined timing criteria discussed below. All transistors have an assigned initial threshold voltage, typically on the high end of the range, around 700 millivolts (mV). Transistors outside the critical paths are set to keep the initial high threshold voltages to minimize leakage current and conserve power drain. Although transistors with a high $V_t$ operate at a slower speed, the fact that they are outside any critical path minimizes any adverse performance effects because the timing constraints are already met with the slower speed. One or more of the transistors in the critical path are adjusted to have a low $V_t$ and thereby switch faster. Although the lower $V_t$ transistors consume more static power in standby mode, the power drain is accepted as a trade-off in favor of increasing speed through the critical path. Thus, a balance is achieved between low $V_t$ transistors in critical path that consume more static power but switch faster, and non-critical path transistors that operate slower with a higher $V_t$ but consume less static power. As a result, the IC is optimized to run at a higher frequency with minimum impact on overall power consumption.

Figure 2:
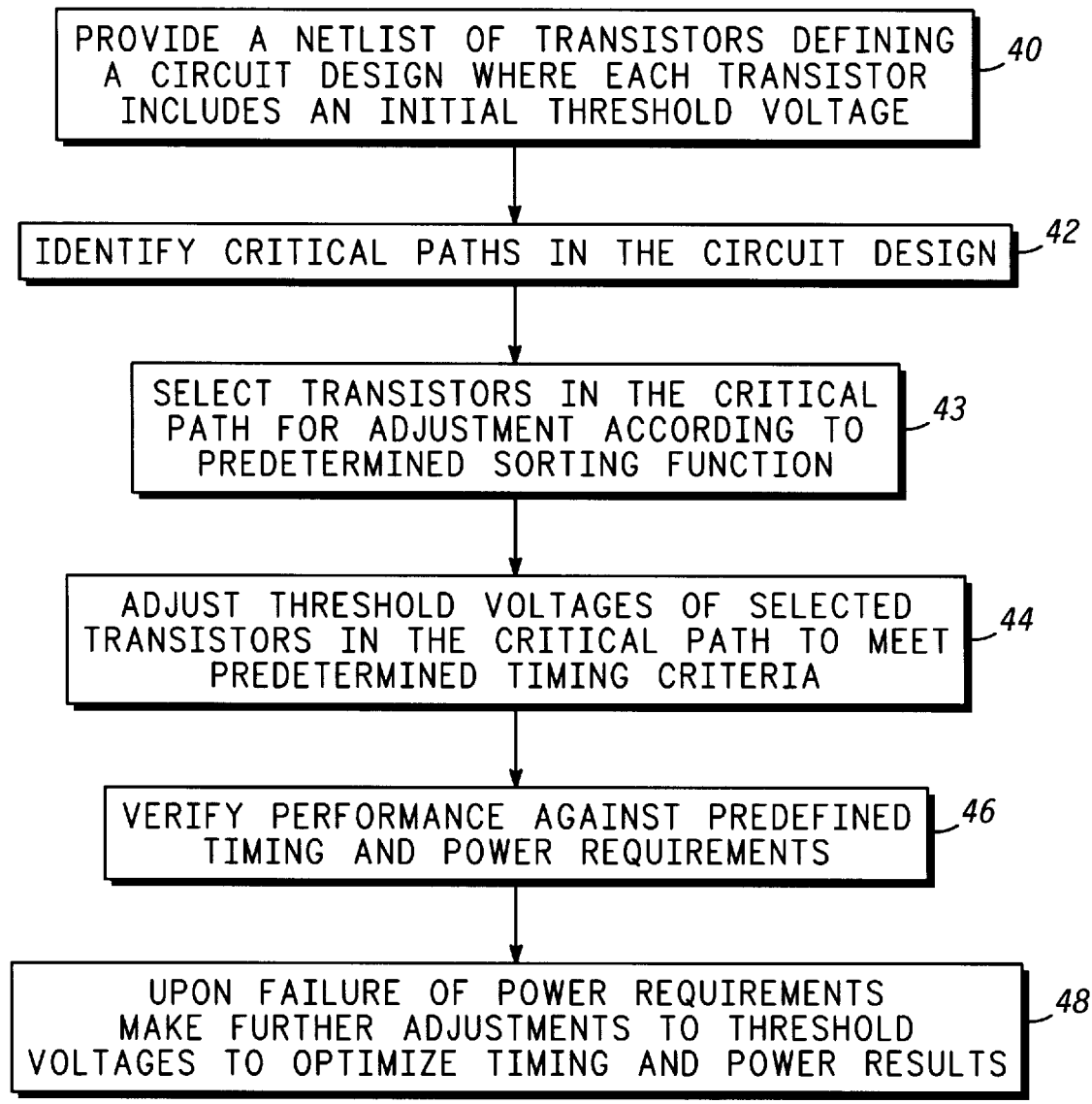
FIG. 2 is a flowchart illustrating steps of increasing speed while reducing static power consumption in the circuit of FIG. 1.

The methodology for selecting threshold voltages for high speed and lower power is shown in FIG. 2. The methodology is executed by computer software on a computer system such as a personal workstation. The computer system with its processor, memory and coding provide the means of performing the steps of FIGS. 2–4. In step 40, a netlist of transistors that define the circuit design is provided including transistors 14–24, 28, and 30. The netlist defines a number of parameters for each transistor necessary for its construction including an initial threshold voltage where it begins to conduct. In one embodiment, all transistors have an initial high threshold voltage of 700 mV. In other embodiments, some transistors have a high initial threshold voltage while others are set to have a lower initial threshold voltage, say 350 mV.

In step 42, the critical paths in the circuit design are identified. A critical path is one that the propagation delay between two nodes separated by circuit elements exceeds or possibly barely meets the maximum timing, which is typically set with respect to the external clock CLK frequency. The longest propagation delay is typically a critical path. A method of identifying the critical path is further described in FIG. 3. For now, assume that inverter 14–16 and NAND gate 18–24 are identified as a critical path, and inverter 28–30 is identified as a non-critical path. In step 43, certain transistors in the critical path are selected to have their threshold voltage adjusted according to a predetermined selection sorting function in order to meet predetermined timing constraints. The transistors are generally selected according to their propensity to increase speed while minimizing impact on static power consumption.

In step 44, the threshold voltage of selected transistors 14–16 and 18–24 in the critical path are adjusted to meet predetermined timing criteria. For the case where all transistors are initially set to a high $V_t$, the adjustment is to lower the threshold voltages of one or more of transistors 14–16 and 18–24 to increase their switching speed and thereby improve timing performance. Again, it is understood that the static power dissipation of the lower $V_t$ transistors increases but the cost is accepted in order to meet the timing constraints. Transistors 28–30 are in the non-critical path and kept at the higher threshold voltage to save static power consumption. The slower speed is considered acceptable because the transistors are not in a critical path, i.e. the timing constraints established for node 31 are already met with the slower speed. It is more important to conserve power where possible.

Step 46 verifies the measured, simulated, or calculated performance of the critical path against the predefined timing criteria while verifying the circuit design as a whole against overall power requirements. If circuit 10 fails timing criteria in simulation, additional transistors in the critical path are assigned lower threshold voltages at the cost of higher static power. If circuit 10 fails static power requirements during simulation, then certain threshold voltages are adjusted as described in step 48. For example, one or more of the threshold voltages in the critical path could be increased, provided the timing criteria is still met. Alternately, one or more of the threshold voltages in the non-critical path could be increased to further reduce static power dissipation while keeping in mind that it is important to assure that a non-critical path does not become critical. Yet another option is to verify that the paths labeled as critical in step 42 are indeed critical to the overall circuit performance. It is possible to falsely identify a propagation path as critical. Not all critical paths have the same impact on the total timing requirements of the circuit design. A propagation path may be re-classified as a non-critical path with its associated high threshold voltage and low power consumption if its timing impact is still within the overall specification.

Figure 3:
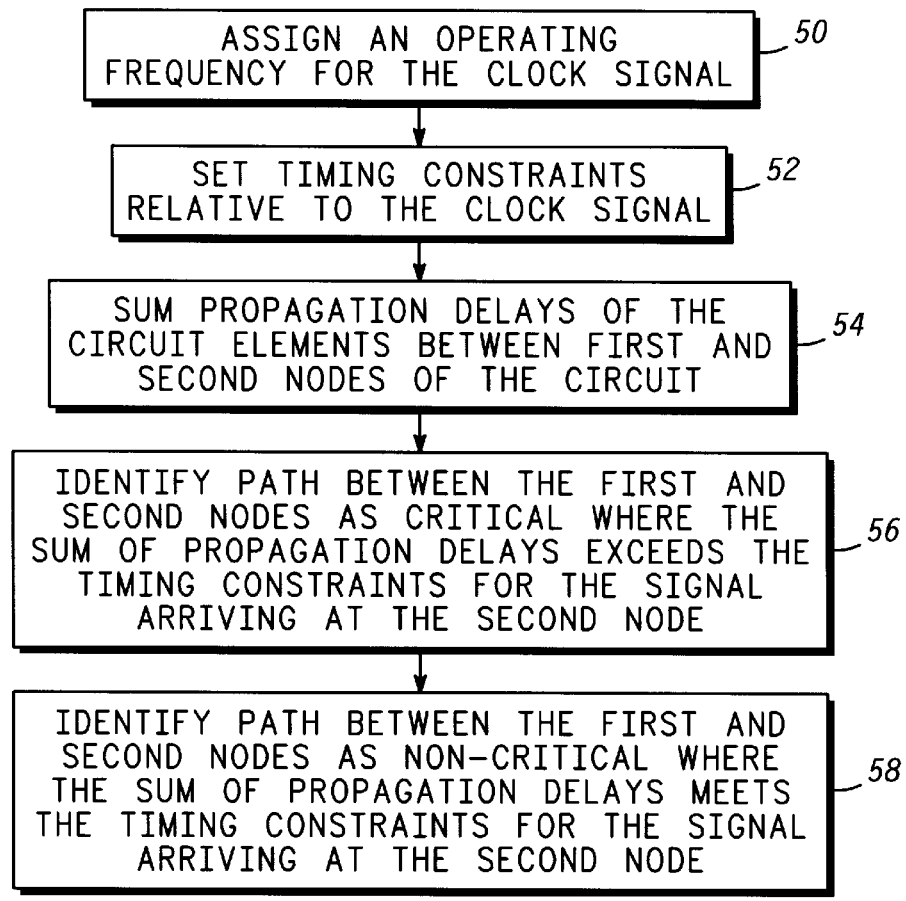
FIG. 3 is a flowchart illustrating steps of identifying the critical paths.

Turning to FIG. 3, further detail of step 42 of identifying the critical path is described as including step 50 where an operating frequency of the clock signal CLK is first assigned, for example 10.0 MHz. In step 52, a number of timing constraints are set according to the circuit function. Timing constraints generally define the arrival time for signals at certain nodes relative to the clock signal as a relative or absolute measurement taking into account the acceptable delay through the transistors in a particular path. For example, one timing constraint is for the signal to arrive at node 25, 5.0 nanoseconds (ns) before the falling edge of the next CLK clock signal after flipflop 12 is clocked. Likewise, another timing constraint is for the signal to arrive at node 31, 5.0 nanoseconds (ns) before the falling edge of the next CLK clock signal. In step 54, the propagation delays of circuit elements between the first and second nodes are summed. For example, if the propagation delay through inverter 14–16, NAND gate 18–24, and inverter 28–30 are each given as 10.0 ns, then the sum of the propagation delays between nodes 13 and 25 is 20.0 ns, and the propagation delay between nodes 13 and 31 is 10.0 ns. The delay through flipflops 12, 26, and 32 are each given as 10.0 ns. In step 56, the path between nodes 13 and 25 is identified as critical if the sum of the propagation delays of the intermediate circuit elements exceeds the timing constraints for the signal arriving at node 25. The path may also be identified as critical if the timing constraints are barely met and the circuit needs some robustness to accommodate process variation and operational drift due to external influences such as temperature. If clock signal CLK has a rising edge every 30.0 ns, then the path between nodes 13 and 25 is critical because the signal A cannot propagate through flipflop 12, inverter 14–16, and NAND gate 18–24 (30.0 ns total delay) and arrive at node 25 5.0 ns before the next rising edge of clock signal CLK which occurs 30 ns later. The predetermined timing constraint is not met between node 13 and 25 and the path is therefore critical.

In step 58, the path between nodes 13 and 31 is identified as non-critical because the sum of the propagation delays of the intermediate circuit elements is within the timing constraints for the signal arriving at node 31. The signal A propagates through flipflop 12 and inverter 28–30 (20.0 ns total delay) and arrives at node 31 at least 5.0 ns before the next rising edge of clock signal CLK, which arrives 30.0 ns later, thereby meeting the timing constraints. Indeed, the additional 5.0 ns of margin may allow the threshold voltages of the transistors in the non-critical path to be further increased to allow more static power savings as discussed above.

Another option is to define an absolute maximum allowable time delay between two nodes. The path between nodes 13 and 25 is identified as critical if the absolute propagation delay exceeds the timing constraint for the signal arriving at node 25. The path between nodes 13 and 31 is identified as non-critical if the absolute propagation delay meets the timing constraint for the signal arriving at node 31. The result of identifying critical paths should be similar since the absolute time is typically set equal to the sum of the delays.

Figure 4:
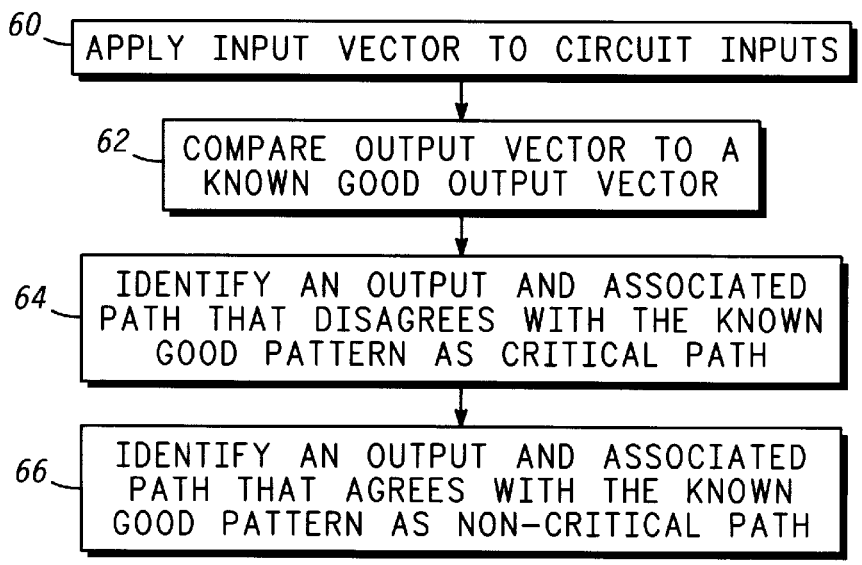
FIG. 4 is a flowchart illustrating alternate steps of identifying the critical paths.

An alternate method of identifying the critical paths is described in FIG. 4. In step 60, an input signal vector, e.g. A=1 and B=1, is applied to the circuit inputs. The known good output signal vector for the given input vector is determined according to the circuit logic. The measured output signal vector from the simulation is compared to the known good output vector and any disagreement may be attributed to timing problems. In step 64, an output and its associated path are identified as critical if it disagrees with the known good output vector. In step 66, an output and its associated path are identified as non-critical if it agrees with the known good output vector. For example, with A=1 and B=1, then OUT1 should be a logic one and OUT2 should be a logic zero after two clock signal CLK periods according to the circuit logic. If OUT1=0 and OUT2=0 then the path through inverter 14–16 and NAND gate 18–24 is identified as critical because it disagrees with the known good output vector, and the path through inverter 28–30 is identified as non-critical because it agrees with the known good output vector. Conversely, if OUT1=1 and OUT2=1 then the path through inverter 14–16 and NAND gate 18–24 is identified as being non-critical and the path through inverter 28–30 is identified as being critical. If both outputs agree with the known good output vector, then both paths are non-critical. If both outputs disagree with the known good output vector, then both paths are critical. The key is to avoid a race condition where flipflops 26 and 32 are clocked before the input signal is ready.

Returning to FIG. 2, step 43 involves selecting transistors in the critical path for adjustment of the threshold voltage according to a predetermined sorting function. For example, the transistors in the critical path can be sorted by the largest individual propagation delay. The propagation delay for a transistor can be determined from parameters such as device size and capacitive loading. The transistors with the largest propagation delay have their threshold voltage reduced to increase switching speed and thereby provide the greatest benefit, i.e. closer to meeting timing constraints for a given change of threshold voltages. The transistors are typically adjusted one at a time and then step 42 is repeated to determine if the path becomes non-critical.

Another method of selecting transistors in the critical path is to sort by the devices having the least impact on increasing static power consumption. Some transistors in the circuit will conduct while the circuit is in standby mode. Certain types of circuit structures such as transmission gates include transistors that do not have a direct path from a power supply potential to ground. Such transistors have negligible impact on static power consumption and should be high on the selection list for lowering the threshold voltage. Transistors that turn off in standby mode should not be so readily selected because lowering their threshold voltage has a greater impact on static power consumption. In another example, small geometry devices in the critical path have a smaller impact on leakage current for a given change in threshold voltage than large geometry devices. Although the contribution to saving static power is typically less, such small geometry transistors can be adjusted to a lower threshold voltage to see if the timing constraints are met and the path is no longer critical.

Yet another method of selecting transistors in the critical path is to sort by a predetermined cost function. For example, one cost function C is C=10D+5S, where D is the propagation delay and S is the static power. The greater the cost function, the more benefit can be achieved by lowering its threshold voltage. In this case, propagation delay, having a coefficient of 10, is given twice as much weight as static power with a coefficient of 5. It is understood that the sorting function can be a multi-level sort including one or more of the above or other sorting options. Good results can be achieved by sorting first by longest propagation delay and second by impact on static power consumption.

One or more transistors in the critical path are selected by simulation as described above to reduce their threshold voltage to provide the greatest benefit in meeting the timing constraints. If the path remains critical after the first adjustment, then the next most beneficial transistors in the critical path are reduced in threshold voltage and so on until the path becomes non-critical.

In the fabrication of an IC with a design not optimized for high speed and low power consumption, it is not unusual for all transistors to receive the same threshold adjust implant. However, once the circuit design has been optimized, the transistors in the critical path identified and particular transistors selected for a reduced threshold voltage, those selected transistors receive a modified implant. Thus an IC with at least both high and low threshold voltage transistors is produced. Implant energies and dopant concentrations and other pertinent process specifics required to produce these threshold voltages are well known to those skilled in the semiconductor processing arts.

By now it should be appreciated that the present invention provides a method of selecting device threshold voltages for high speed and low power. The critical paths of circuit 10 are identified by predetermined timing criteria. All transistors have an assigned initial threshold voltage, typically around 700 mV. Transistors outside the critical paths are set to keep the initial high threshold voltages to minimize leakage current and conserve static power drain. Although transistors with a high $V_t$ operate at a slower speed, the fact that they are outside any critical path minimizes any adverse performance effects because the timing constraints are already met with the slower speed. One or more of the transistors in the critical path are adjusted to have a low $V_t$ and thereby switch faster. Although the lower $V_t$ transistors consume more static power in standby mode, the power drain is accepted as a trade-off in favor of increasing speed through the critical path. Thus, a balance is achieved between low $V_t$ transistors in the critical path that consume more static power but switch faster, and non-critical path transistors that operate slower with higher $V_t$ but consume less static power. As a result, the IC is optimized to run at higher frequency with lower overall power consumption.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A computer implemented method of selecting a device threshold voltage, comprising the steps of:

identifying a critical path through a circuit;

selecting devices in said critical path according to a predetermined cost function to adjust the threshold voltage of at least one of the selected devices, wherein the cost function includes at least two components, a first component dependent on process parameters and a second component dependent on design specific parameters; and adjusting the threshold voltage of said at least one of the selected devices in said critical path to meet predetermined timing criteria.

2. The method of claim 1 wherein said step of identifying a critical path includes the steps of:

assigning an operating frequency for a clock signal; and setting timing constraints for nodes within said circuit relative to said clock signal.

3. The method of claim 2 wherein said step of identifying a critical path further includes the steps of:

summing propagation delays of circuit elements of said circuit between first and second nodes;

identifying a path between said first and second nodes as critical if said sum of propagation delays exceeds said timing constraint for a signal arriving at said second node; and identifying a path between said first and second nodes as non-critical if said sum of propagation delays meets said timing constraint for said signal arriving at said second node.

4. The method of claim 2 wherein said step of identifying a critical path further includes the steps of:
   allocating an absolute propagation delay between first and second nodes;
   identifying a path between said first and second nodes as critical if said absolute propagation delay exceeds said timing constraint for a signal arriving at said second node; and
   identifying a path between said first and second nodes as non-critical if said absolute propagation delay meets said timing constraint for said signal arriving at said second node.

5. The method of claim 1 wherein said step of identifying a critical path includes the steps of:
   applying an input vector to inputs of said circuit;
   comparing a measured output vector to a known good output vector;
   identifying an output and associated path as critical if said measured vector disagrees with said known good output vector; and
   identifying an output and associated path as non-critical if said measured vector agrees with said known good output vector.

6. The method of claim 1 wherein said second component dependent on design specific parameters includes a component that has a largest individual propagation delay.

7. The method of claim 1 wherein said second component dependent on design specific parameters includes a component that has a least impact on static power consumption.

8. The method of claim 1 wherein said second component dependent on design specific parameters includes a sub-component that has a least impact on static power consumption and a sub-component that has a largest individual propagation delay.

9. A computer implemented method of selecting a device threshold voltage, comprising the steps of:
   providing a netlist of devices in a circuit each including an initial threshold voltage;
   identifying a critical path through said circuit;
   selecting devices in said critical path according to a predetermined cost function to adjust the initial threshold voltage, wherein the cost function includes at least two components, a first component dependent on process parameters and a second component dependent on design specific parameters; and
   adjusting the threshold voltage of said selected devices in said critical path to meet predetermined timing criteria.

10. The method of claim 9 wherein said step of identifying a critical path includes the steps of:
    assigning an operating frequency for a clock signal; and
    setting timing constraints for nodes within said circuit relative to said clock signal.

11. The method of claim 10 wherein said step of identifying a critical path further includes the steps of:
    summing propagation delays of circuit elements of said circuit between first and second nodes;
    identifying a path between said first and second nodes as critical if said sum of propagation delays exceeds said timing constraint for a signal arriving at said second node; and
    identifying a path between said first and second nodes as non-critical if said sum of propagation delays meets said timing constraint for said signal arriving at said second node.

12. The method of claim 10 wherein said step of identifying a critical path further includes the steps of:
    allocating an absolute propagation delay between first and second nodes;
    identifying a path between said first and second nodes as critical if said absolute propagation delay exceeds said timing constraint for a signal arriving at said second node; and
    identifying a path between said first and second nodes as non-critical if said absolute propagation delay meets said timing constraint for said signal arriving at said second node.

13. The method of claim 9 wherein said step of identifying a critical path includes the steps of:
    applying an input vector to inputs of said circuit;
    comparing a measured output vector to a known good output vector;
    identifying an output and associated path as critical if said measured vector disagrees with said known good output vector; and
    identifying an output and associated path as non-critical if said measured vector agrees with said known good output vector.

14. The method of claim 9 wherein said second component dependent on design specific parameters includes a component that has a largest individual propagation delay.

15. The method of claim 9 wherein said second component dependent on design specific parameters includes a component that has a least impact on static power consumption.

16. The method of claim 9 wherein said second component dependent on design specific parameters includes a component a sub-component that has a least impact on static power consumption and a sub-component that has a largest individual propagation delay.

17. An apparatus for selecting a device threshold voltage, comprising:
    means for identifying a critical path through a circuit;
    means for selecting devices in said critical path according to a predetermined cost function to adjust a threshold voltage of at least one selected device, wherein the cost function includes at least two components, a first component dependent on process parameters and a second component dependent on design specific parameters; and
    means for adjusting the threshold voltage of said at least one selected device in said critical path to meet predetermined timing criteria.

18. The apparatus of claim 17 wherein said means for identifying a critical path includes:
    means for defining an operating frequency for a clock signal;
    means for setting timing constraints for nodes within said circuit relative to said clock signal;
    means for summing propagation delays of circuit elements of said circuit between first and second nodes;
    means for identifying a path between said first and second nodes as critical if said sum of propagation delays exceeds said timing constraint for a signal arriving at said second node; and
    means for identifying a path between said first and second nodes as non-critical if said sum of propagation delays meets said timing constraint for said signal arriving at said second node.

19. The apparatus of claim 18 wherein said means for selecting devices in said critical path includes means for sorting devices by a predetermined cost function.

* * * * *